(12) United States Patent
Marques

(10) Patent No.: US 11,031,946 B1
(45) Date of Patent: Jun. 8, 2021

(54) APPARATUS AND METHOD FOR LOW-LATENCY LOW-POWER ANALOG-TO-DIGITAL CONVERSION WITH HIGH INPUT SIGNALS

(71) Applicant: Adesto Technologies Corporation, Santa Clara, CA (US)

(72) Inventor: Joao Pedro Santos Cabrita Marques, Santa Clara, CA (US)

(73) Assignee: Dialog Semiconductor

( * ) Notice: Subject to any disclaimer, the term of this patent is extended or adjusted under 35 U.S.C. 154(b) by 0 days.

(21) Appl. No.: 16/795,351

(22) Filed: Feb. 19, 2020

(51) Int. Cl.
- *H03M 1/12* (2006.01)
- *H03M 1/44* (2006.01)
- *H03M 1/46* (2006.01)
- *H03M 1/00* (2006.01)

(52) U.S. Cl.
CPC ........... *H03M 1/442* (2013.01); *H03M 1/002* (2013.01); *H03M 1/462* (2013.01)

(58) Field of Classification Search
CPC ...... H03M 1/442; H03M 1/002; H03M 1/462; H03M 1/12; H03M 1/00
USPC ................................................. 341/155, 161
See application file for complete search history.

(56) References Cited

U.S. PATENT DOCUMENTS

| | | | | |
|---|---|---|---|---|
| 7,773,024 B2 * | 8/2010 | Ohnhauser | ............ | H03M 1/129 341/172 |
| 7,965,218 B2 * | 6/2011 | Ohnhaeuser | ............ | H03M 1/08 341/172 |
| 8,072,360 B2 * | 12/2011 | Byrne | ................ | H03M 1/1225 341/118 |
| 8,581,770 B2 * | 11/2013 | Wang | ................ | H03M 1/1295 341/172 |
| 8,754,798 B2 * | 6/2014 | Lin | ......................... | H03M 1/10 341/155 |
| 9,191,018 B2 * | 11/2015 | Kull | ....................... | H03M 1/002 |
| 9,379,726 B1 * | 6/2016 | Wang | .................... | H03M 1/125 |
| 9,831,889 B1 * | 11/2017 | Abu Hilal | ............ | H03M 1/1071 |
| 10,135,453 B2 * | 11/2018 | Hernes | ................... | H03M 1/466 |
| 2015/0249463 A1 * | 9/2015 | Alladi | ................ | H03M 1/1245 341/150 |
| 2017/0033800 A1 * | 2/2017 | Yuan | ................... | H03M 1/1245 |
| 2017/0317683 A1 * | 11/2017 | Bandyopadhyay | ... | H03M 3/426 |
| 2018/0097535 A1 * | 4/2018 | Gordon | .................. | H03M 1/04 |

* cited by examiner

*Primary Examiner* — Jean B Jeanglaude

(57) ABSTRACT

Accordingly, embodiments of the present invention provide a method and apparatus for low-latency, low-power dissipation analog-to-digital conversion. A SAR ADC is implemented using internal signal attenuation, after the signal being sampled, to convert accuracy into speed, allowing higher clock frequency and therefore smaller latency. Some embodiments of the low-latency, low-power dissipation analog-to-digital converters described herein are particularly well-suited to industrial motor control applications, such as analog-to-digital converters that convert relatively high amplitude signals to control motors of robotic or automated industrial manufacturing systems and devices. The reduced latency data conversion of the ADCs allows motor control systems to quickly respond to unanticipated stimulus, which is critical for certain applications, such as robots operating in noisy and unpredictable environments.

20 Claims, 10 Drawing Sheets

APPARATUS AND METHOD FOR LOW-LATENCY LOW-POWER ANALOG-TO-DIGITAL CONVERSION WITH HIGH INPUT SIGNALS

FIELD

Embodiments of the present invention generally relate to the field of electronic circuits. More specifically, embodiments of the present invention relate to low-power analog-to-digital converters for electronic circuits, where the input signals are relatively high.

BACKGROUND

Analog-to-digital converters (ADC) are a common component of modern electronic devices that receive an analog input signal and convert the analog input signal to a digital output represented by bits of data. For example, the sound detected by a microphone or the light entering a digital camera are forms of analog signals that can be converted into a digital signal by an ADC. An ADC may also be used to measure an isolated value such as an analog voltage or current during a sampling phase that is converted to a digital number representing the magnitude of the voltage or current during a decision phase.

ADCs are also commonly used in industrial or manufacturing environments to control motor operations of robotic or automated manufacturing systems (e.g., robots). In these cases, the latency of the ADC is a critical metric that must be kept as low as possible so that the manufacturing system can quickly and adequately respond to unanticipated stimulus, which is critical for certain applications, such as robots operating in a noisy or unpredictable industrial environment.

The stimuli applied to control motor operations that is converted by an ADC are usually relatively large (e.g., high amplitude) signals that require relatively large devices of sufficient size to perform analog-to-digital conversion without being damaged, which are typically quite slow, thereby causing large latencies when converting the analog input signal. Latency typically refers to the time interval between the stimulation and the response in an electronic circuit or system. For an ADC, the latency represents the time interval between when the converter captures the analogue signal and when the digital-output word is ready for retrieval. In general, ADCs implemented with smaller geometry technologies may provide faster output, but may not be able to handle large input signals without breaking or experiencing stress or damage.

As depicted in FIG. 1, the latency of an exemplary ADC can be expressed as a number of clock cycles $L_C$. The number of clock cycles $L_C$ can be defined as $L_C=N/2$, where N is an integer. The Latency L (measured in seconds) can be calculated as $L=L_C/f_{CLK}$ where $f_{CLK}$ represents a clock frequency. As depicted in FIG. 1, the exemplary ADC requires $L_C$ clock cycles to output digital data. To reduce latency L of an ADC, the clock frequency $f_{CLK}$ can be increased. However, large analog signals require large, thick oxide devices which are inherently slower devices and therefore limiting the maximum clock frequency that can be used. The latency of the ADC can also be theoretically reduced by reducing N, however a minimum N is typically fixed according to the ADC architecture. Latency can also be decreased by increasing power, but many battery operated devices do not allow for this solution and rather demand low power components.

FIGS. 2-4 depict exemplary ADC architectures that represent the shortcomings of existing ADC implementations for low-power, low-latency applications.

FIG. 2 depicts an exemplary prior art ADC architecture 200 including a Flash ADC (also known as a "Parallel ADC"). The Flash ADC architecture features one of the fastest performances (e.g., lowest latency) for performing analog-to-digital conversion; however, the power dissipation of the Flash ADC is also one of the highest of the existing ADC architectures, making the Flash ADC architecture ill-suited to applications that require low-latency and low-power dissipation, such as industrial motor control applications.

FIG. 3 depicts an exemplary prior art ADC architecture 300 including a pipeline ADC. The pipeline ADC provides higher sampling rates by pipelining input values through different stages (e.g., stages 1-4). In the pipeline ADC architecture, the output from each ADC stage must be time aligned and combined to produce an output. Moreover, digital error correction must be performed before output, which increases its latency and makes the pipeline ADC architecture ill-suited to applications that require low-latency and low-power dissipation, such as industrial motor control applications.

FIG. 4 depicts an exemplary prior art ADC architecture 400 including a time-interleaved ADC. A time-interleaved ADC with a conversion rate $F_S$ is comprised of M ADC slices, each slice running at a lower rate $F_S/M$. This solution relaxes the devices' maximum frequency operation by a factor of M. However, time-interleaved ADCs require digital calibration due to the mismatch between slices, which increases latency, making them ill-suited to applications that require low-latency and low-power dissipation, such as industrial motor control applications.

FIG. 5 depicts an exemplary prior art ADC architecture 500 including a Successive Approximation Register (SAR) ADC. An output word can be available in the period immediately after sampling, and the latency of the ADC is very low because the internal frequency at which the SAR ADC works is higher than the sampling rate of the ADC. The maximum conversion rate $F_S$ is limited based on the internal device's maximum operating frequency $k*F_S$. Specifically, for every conversion at $F_S$ rate, the comparator of the SAR ADC running at $k*F_S$ requires k decisions, where k>n and n is the ADC resolution, in number of bits. The performance of a SAR ADC is adequate for industrial control applications, but fast devices will not be suitable to reliably handle such large input signals.

Another existing approach for reducing the latency of ADCs involves attenuating the input signal prior to analog-to-digital conversion. Using active circuit attenuation can advantageously result in high input impedance; however the overall power dissipation of the ADC will increase significantly. Actively attenuating the input signal prior to analog-to-digital conversion may also add constraints to the operable voltage range. When using passive resistive circuit attenuation, on the other hand, a resistive voltage divider will add thermal noise to the circuit and will limit the maximum signal bandwidth. Relaxing these specifications may require a significant increase in overall power dissipation of the circuit. For these reasons, existing approaches to signal attenuation for reducing latency of ADCs is ill-suited to applications that require low-latency and low-power dissipation, such as industrial motor control applications.

Reducing the latency when converting analog signals using existing techniques typically leads to higher power dissipation, as describes above, which is unacceptable to the emerging Industrial Internet of Things (IIoT) market that demands ultra-low-power solutions for small form factors and battery operated equipment. Therefore, what is needed is a method and apparatus for reducing ADC latency while maintaining very low power dissipation.

SUMMARY

Accordingly, embodiments of the present invention provide a method and apparatus for low-latency, low-power dissipation analog-to-digital conversion of a relatively high input signal. A SAR ADC is implemented using internal signal attenuation, after the signal being sampled, to convert accuracy into speed, allowing higher clock frequency and therefore smaller latency. Some embodiments of the low-latency, low-power dissipation analog-to-digital converters described herein are particularly well-suited to industrial motor control applications, such as analog-to-digital converters that convert relatively high amplitude input signals to control motors of robotic or automated industrial manufacturing systems and devices. The reduced latency data conversion of the ADCs allows motor control systems to quickly respond to unanticipated stimulus, which is critical for certain applications, such as robots operating in noisy and unpredictable environments.

According to one embodiment, a device for converting an analog input signal to a digital signal is disclosed. The device includes a successive approximation register (SAR) analog-to-digital converter (ADC) including a plurality of switched capacitors, the plurality of switched capacitors increasing a signal-to-noise ratio (SNR) level of the SAR ADC to achieve a performance margin during a sampling phase performed by the SAR ADC, one or more switched capacitors of the plurality of switched capacitors being operable to be switched to internally attenuate the analog input signal according to the performance margin during a decision phase performed by the SAR ADC. The SAR ADC outputs the digital signal according to the sampling phase and the decision phase performed by the SAR ADC.

According to some embodiments, the SAR ADC includes thin gate transistors.

According to some embodiments, the one or more switched capacitors of the plurality of switched capacitors are operable to be switched using charge redistribution.

According to some embodiments, the device includes a reset phase configuration that is performed by the SAR ADC before said sampling phase configuration is performed by the SAR ADC.

According to some embodiments, the one or more switched capacitors of the plurality of switched capacitors are operable to provide a unity gain.

According to some embodiments, the one or more switched capacitors of the plurality of switched capacitors are operable to internally attenuate the analog input signal by an attenuation factor of 2.

According to some embodiments, the SAR ADC includes a 3-bit ADC.

According to some embodiments, the device provides relatively low-latency and relatively low-power dissipation for motor control operations.

According to some embodiments, the device is operable to convert the analog input signal of an automated manufacturing system.

According to some embodiments, the device is battery powered.

According to another embodiment, a method of converting an analog input signal to a digital signal using a successive approximation register (SAR) analog-to-digital converter (ADC) is disclosed. The method includes increasing the signal-to-noise ratio level of the SAR ADC to achieve a performance margin during a sampling phase performed by the SAR ADC, the SAR ADC including a plurality of switched capacitors, reconfiguring one or more switched capacitors of the plurality of switched capacitors to internally attenuate the analog input signal according to the performance during a decision phase performed by the SAR ADC, and outputting the digital signal according to the sampling phase and the decision phase performed by the SAR ADC.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in a figure herein (e.g., FIG. 10) describing the operations of this method, such steps and sequencing are exemplary. Embodiments are well suited to performing various other steps or variations of the steps recited in the flowchart of the figure herein, and in a sequence other than that depicted and described herein.

Accordingly, embodiments of the present invention provide a method and apparatus for low-latency, low-power dissipation analog-to-digital conversion of relatively high input signals. A SAR ADC is implemented using internal signal attenuation, after the signal being sampled, to convert accuracy into speed, allowing higher clock frequency and therefore smaller latency. Some embodiments of the low-latency, low-power dissipation analog-to-digital converters described herein are particularly well-suited to industrial motor control applications, such as analog-to-digital converters that convert large input signals to control motors of robotic or automated industrial manufacturing systems and devices. The reduced latency data conversion of the ADCs allows motor control systems to quickly respond to unanticipated stimulus, which is critical for certain applications, such as robots operating in noisy and unpredictable environments.

Figure 1:
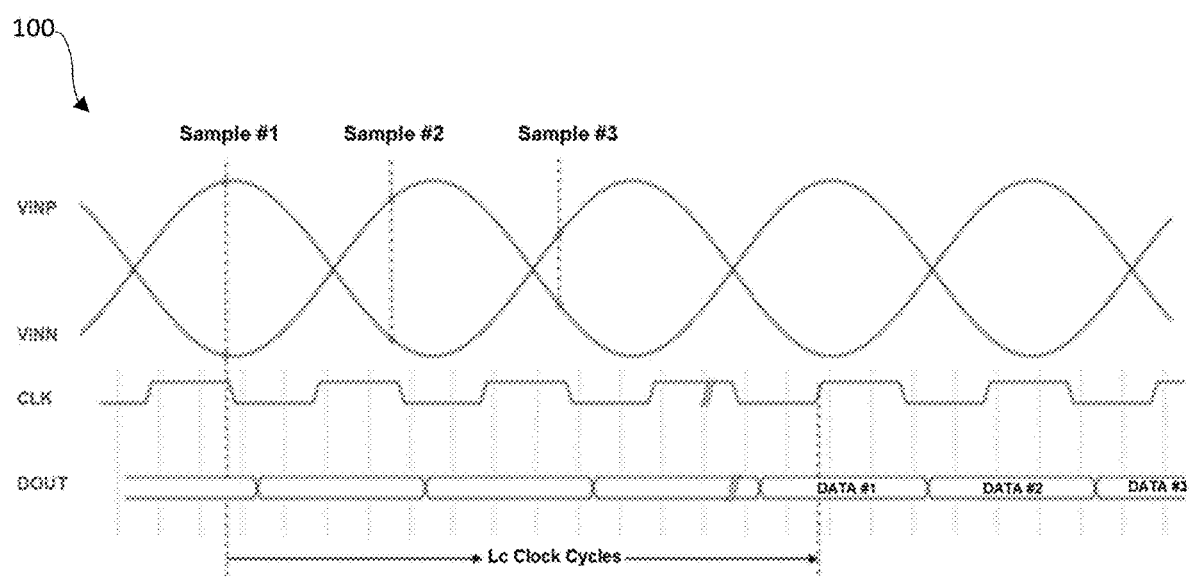
FIG. 1 is a timing diagram of an exemplary analog-to-digital converter that requires $L_C$ clock cycles for conversion.
Figure 2:
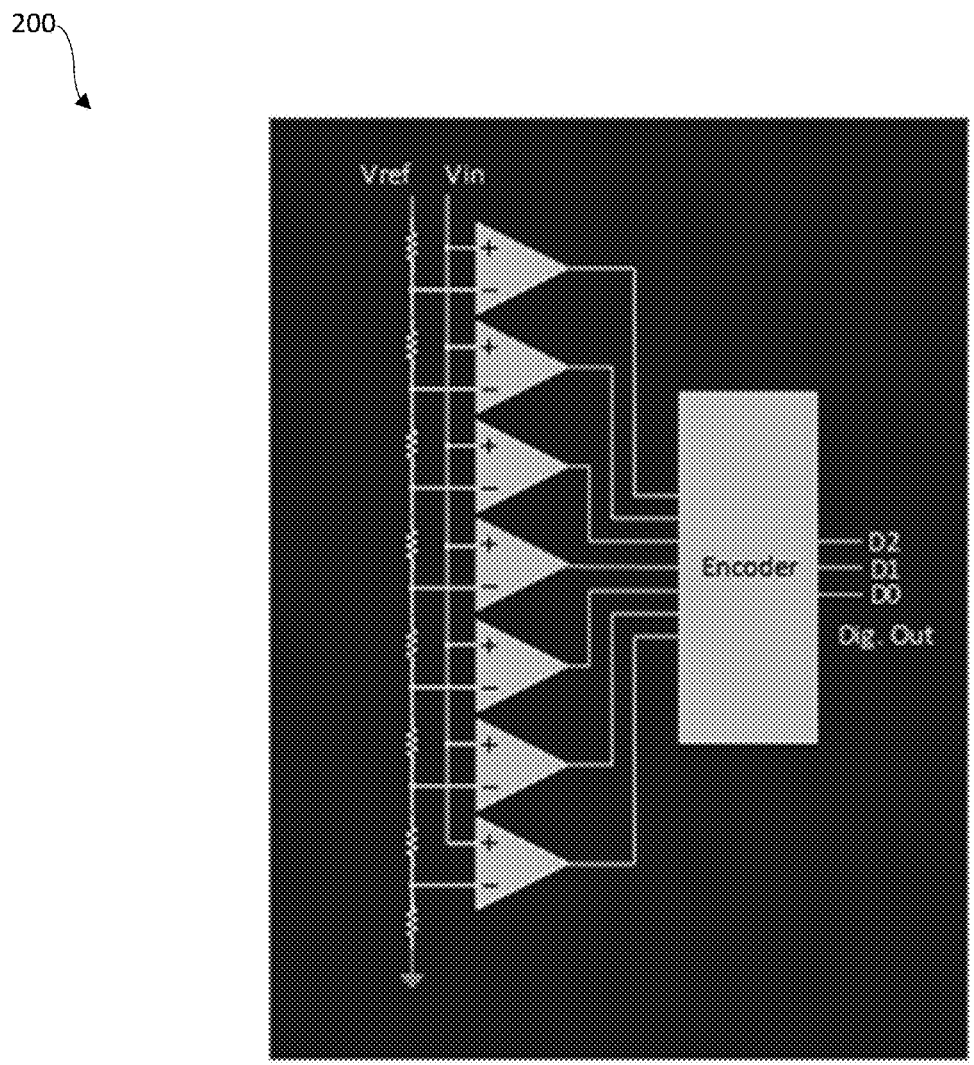
FIG. 2 is a block diagram depicting an exemplary prior art ADC architecture including a Flash ADC (also known as a "Parallel ADC").
Figure 3:
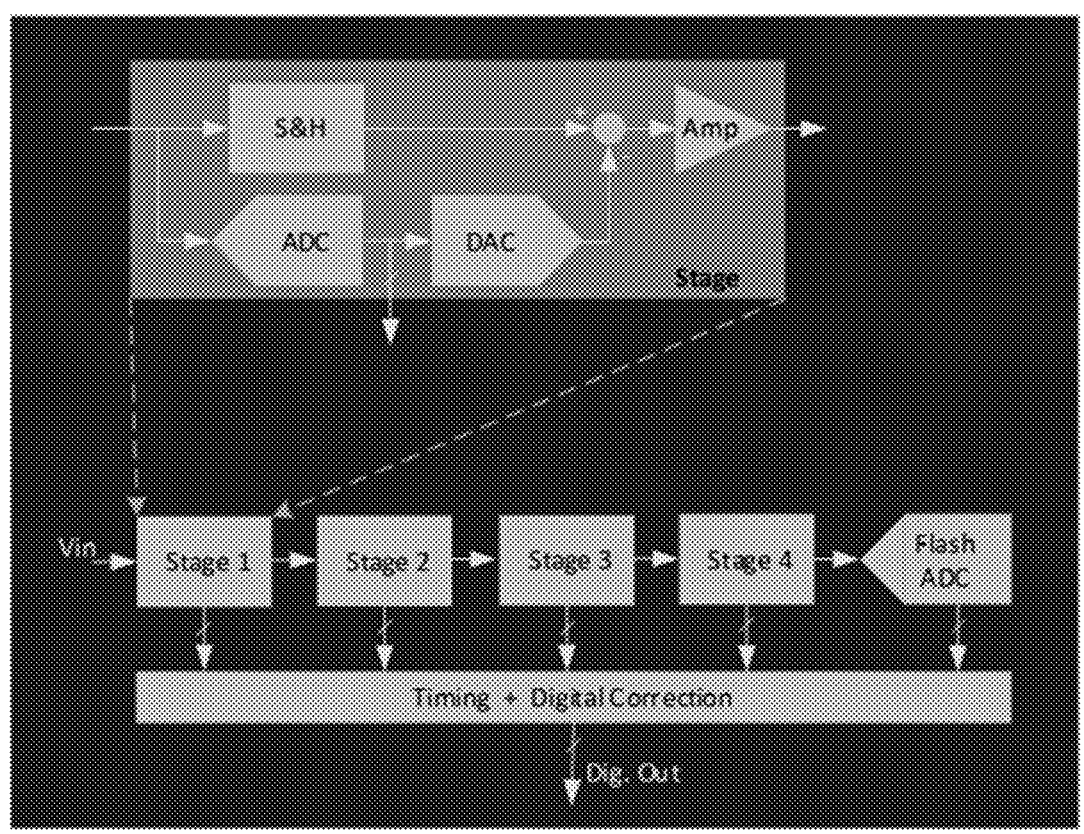
FIG. 3 is a block diagram depicting an exemplary prior art ADC architecture including a pipeline ADC.
Figure 4:
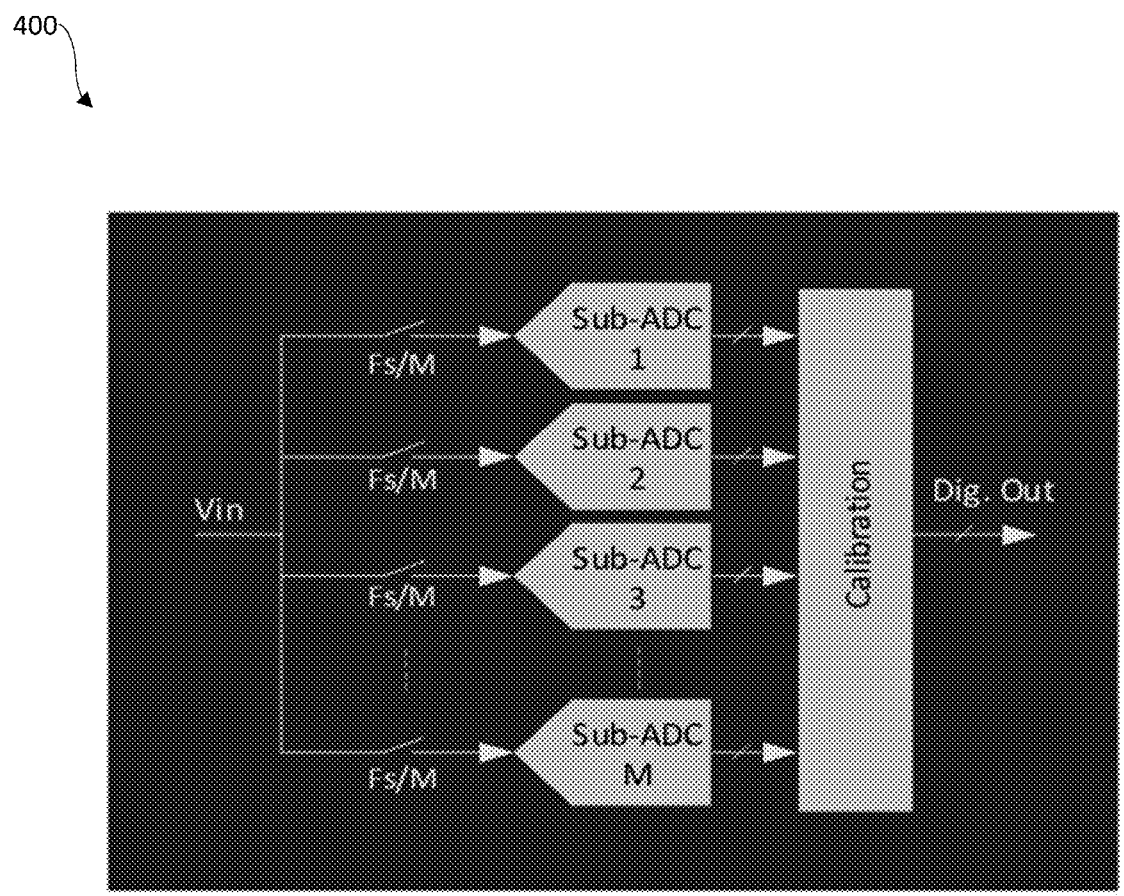
FIG. 4 is a block diagram depicting an exemplary prior art ADC architecture including a time-interleaved ADC.
Figure 5:
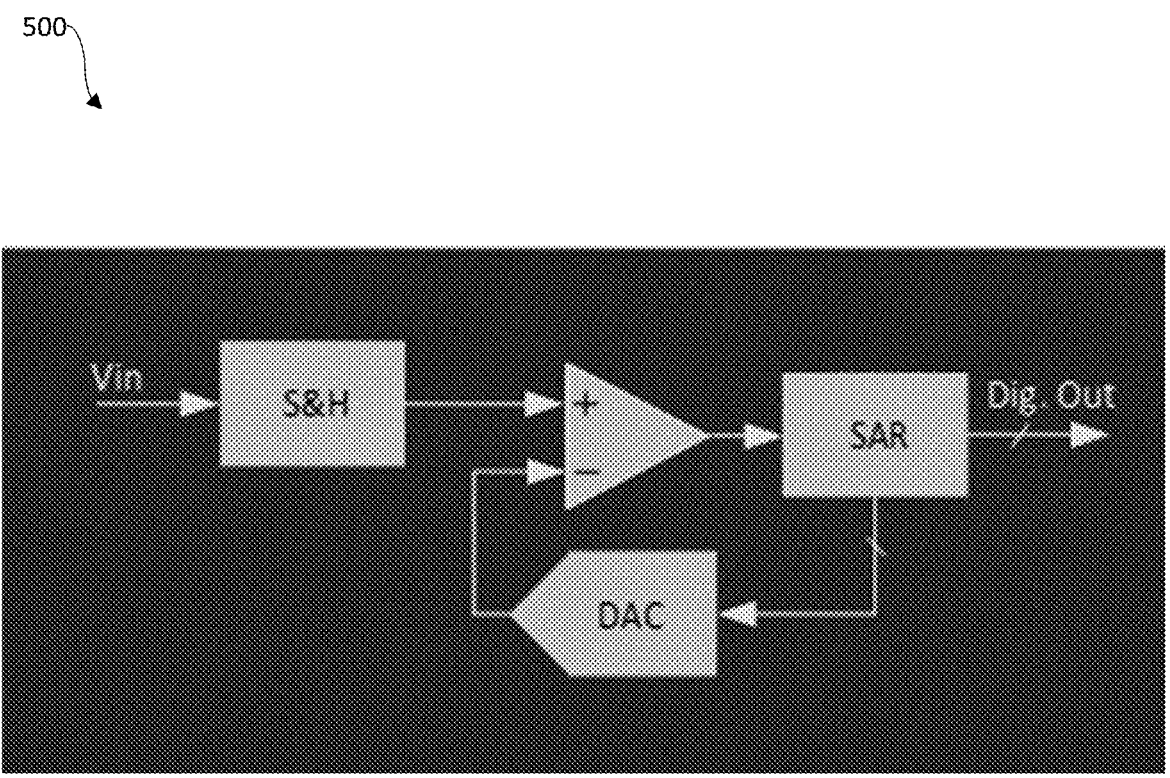
FIG. 5 is a block diagram depicting an exemplary prior art ADC architecture 500 including a Successive Approximation Register (SAR) ADC.
Figure 6:
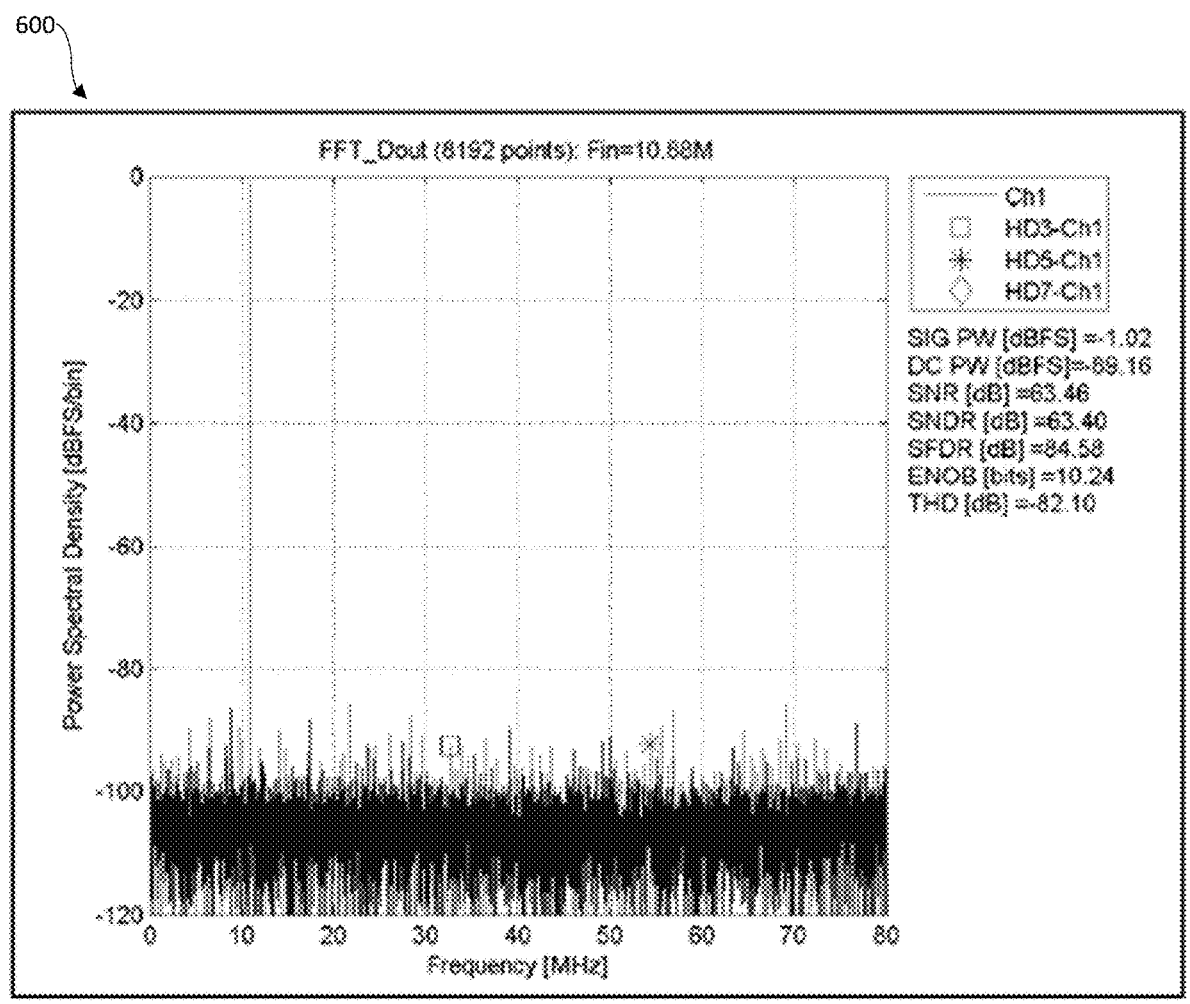
FIG. 6 is a chart depicting the power spectral density of an exemplary SAR ADC at frequencies up to 80 MHz.

According to one embodiment of the present invention, a low-power SAR ADC architecture is implemented using internal signal attenuation. As depicted in FIG. 6, high-frequency SAR ADCs can be inherently highly linear and the performance thereof may be limited by noise, in particular the kT/C noise related to the switched-capacitor sampling network. The performance as measured by the signal to noise and distortion ratio (SNDR) thereof can be improved by reducing the thermal noise at the cost of higher power dissipation. Therefore, to reduce the latency of an n-bit resolution ADC, the performance of the ADC is increased internally (e.g., at the sampling stage) at the cost of a relatively minor increase in power dissipation. The additional performance margin gained by attenuation can be converted into speed, thereby allowing higher clock frequencies $f_{CLK}$ and smaller latency L. FIG. 6 depicts a chart 600 showing the power spectral density of an exemplary SAR ADC at frequencies up to 80 MHz.

Figure 7:
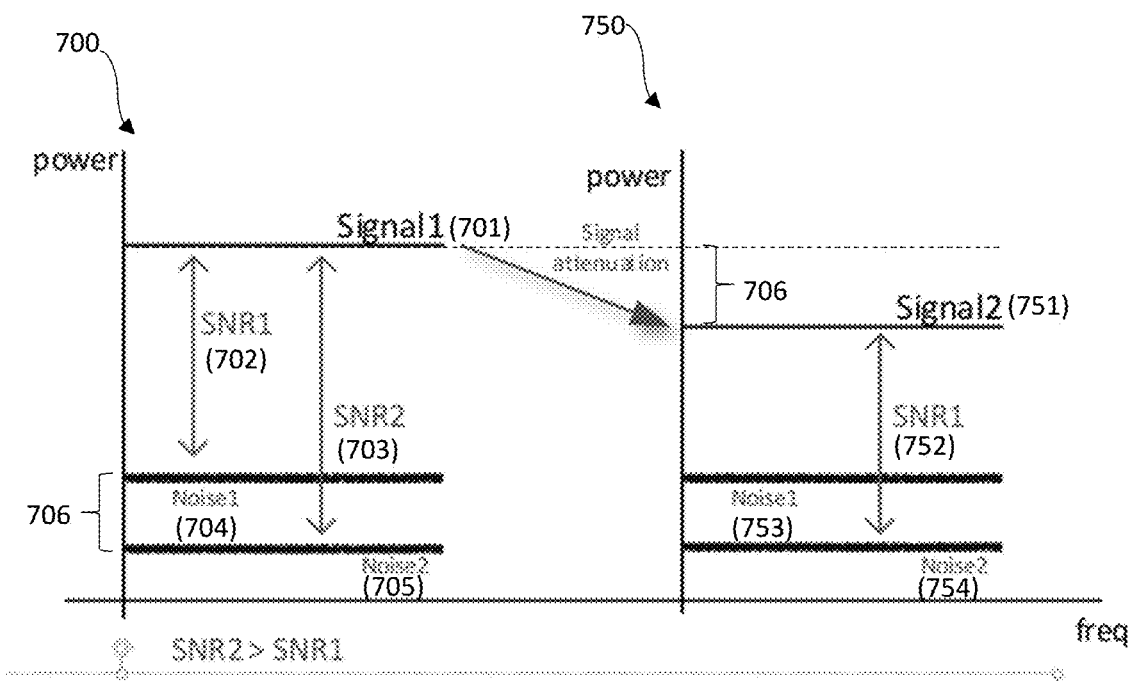
FIG. 7 depicts exemplary charts showing signal-to-noise ratios of an exemplary circuit implementing a low-power, low-latency SAR ADC according to embodiments of the present invention. The charts show the power level corresponding to the frequency that the circuit operates at before and after internal signal attenuation.

FIG. 7 depicts exemplary charts 700 and 750 showing signal-to-noise ratios (SNRs) of an exemplary circuit implementing a low-power, low-latency SAR ADC according to embodiments of the present invention. The charts 700 and 750 show the power level corresponding to the frequency that the circuit operates at before (chart 700) and after (chart 750) internal signal attenuation. Specifically, chart 700 represents an input signal and noise levels during a sampling phase of the exemplary circuit, and chart 750 represents an input signal and noise levels during a decision phase of the exemplary circuit.

Signal 1 (701) depicted in chart 700 is a relatively high amplitude input signal that typically requires a large, slow ADC to reliably convert the input signal without experiencing damage. The ADC resolution initially targets the performance level of SNR1 (702), which is the ratio of the Signal 1 (701) input signal over the noise level 1 (704). However, the performance of the ADC can be increased internally during the sampling phase to produce noise level 2 (705) and achieve the performance level of SNR2 (703). The improved performance is reflected by the increased performance margin 706 between noise level 1 (704) and noise level 2 (705). For example, a switched capacitor implementation including larger capacitors can be used to reduce kT/C noise and achieve the performance level of noise level 2 (705).

Figure 8:
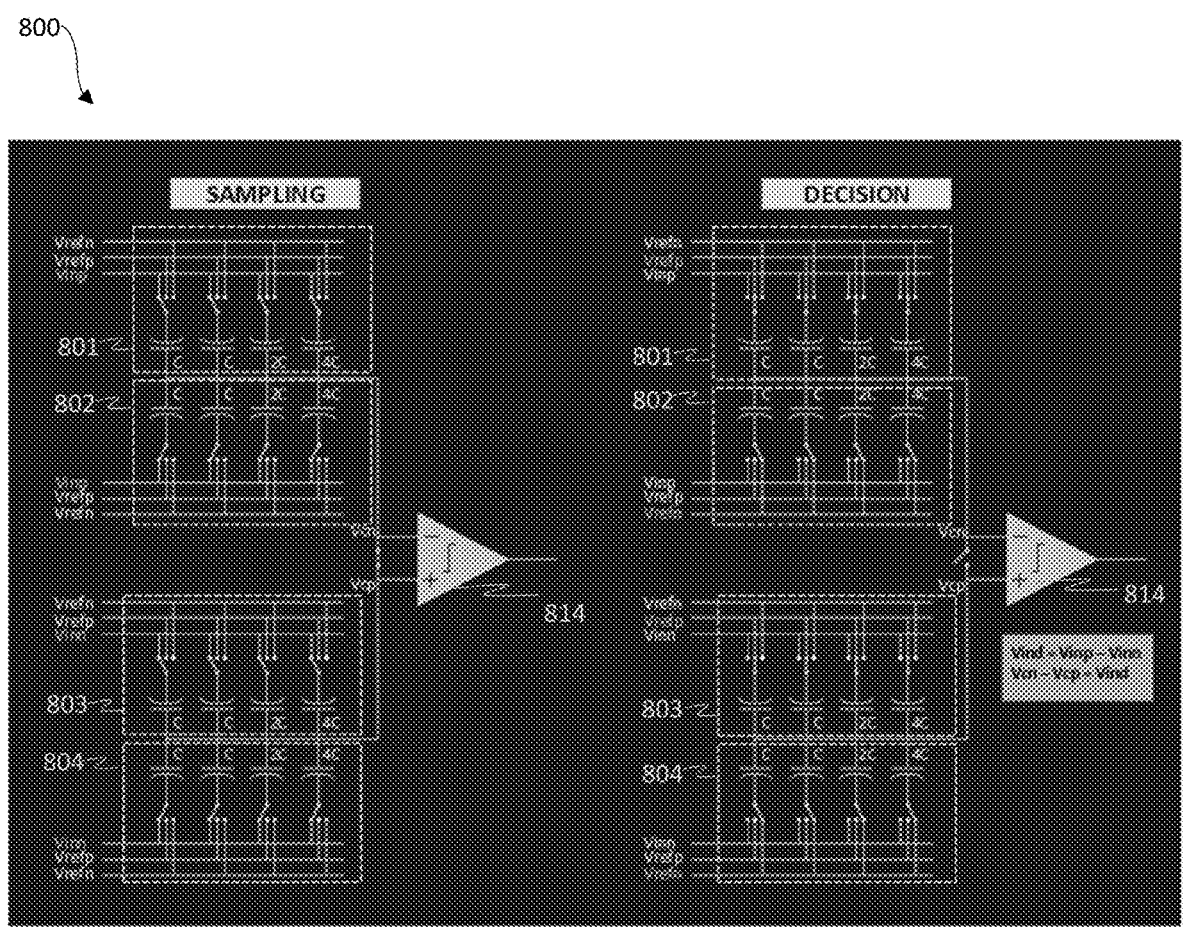
FIG. 8 is a diagram depicting an exemplary SAR ADC implementation using a DAC capacitor matrix configured using charge redistribution to internally attenuate the input signal of a switched-cap SAR ADC front-end according to embodiments of the present invention.
Figure 9:
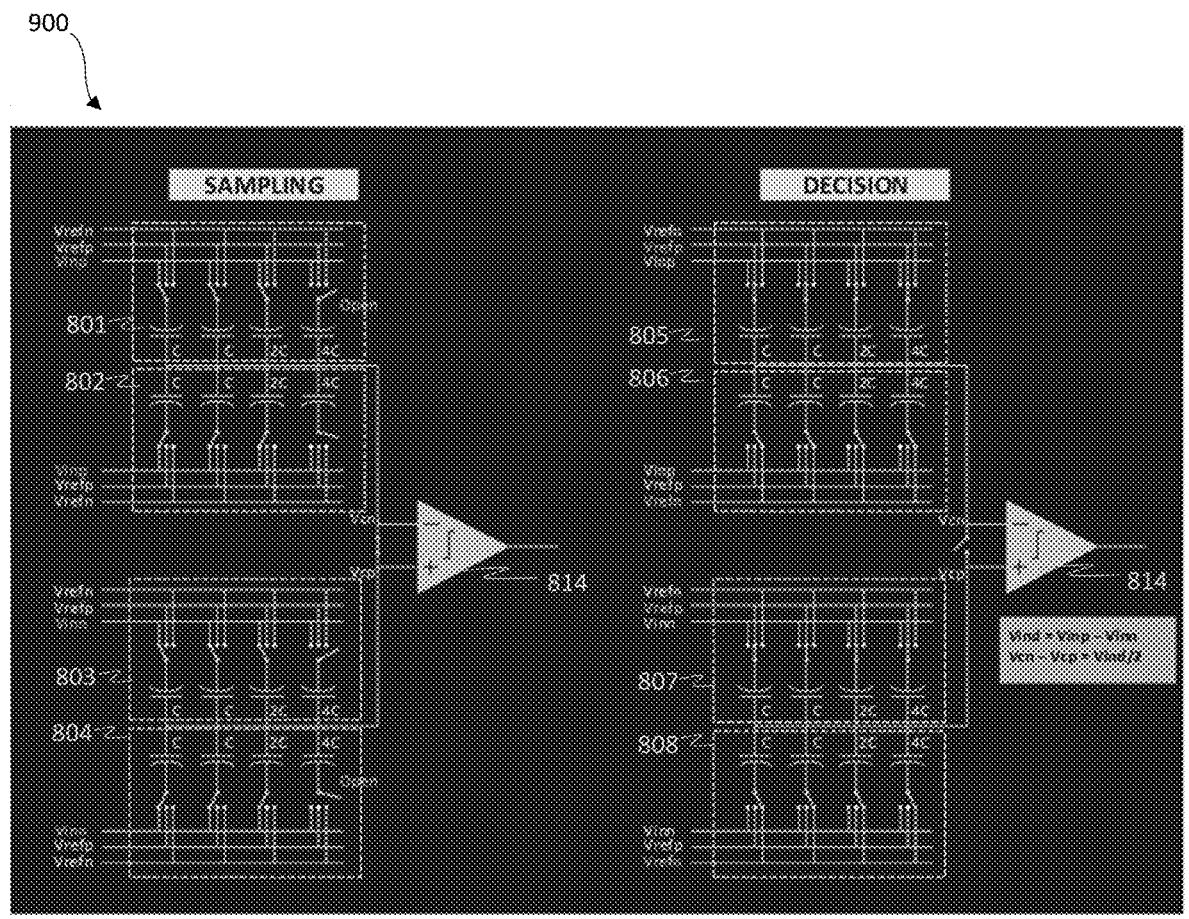
FIG. 9 is a diagram depicting a switching configuration of switches during a decision phase of the exemplary SAR ADC implementation depicted in FIG. 8 to internally attenuate the input signal according to embodiments of the present invention.

The attenuation in a switched capacitor ("switched-cap") implementation of the SAR ADC can be achieved with a simple reconfiguration of the DAC capacitor matrix using charge redistributions as depicted in FIGS. 8 and 9. Using larger capacitors to internally attenuate the signal increases power dissipation somewhat, but the SAR ADC architecture nevertheless provides very low power dissipation compared to other alternative implementations. Moreover, the SAR ADC implemented using larger capacitors does not require front-end attenuation block and a very small and compact architecture can be used. The smaller footprint required also reduces the cost of the device because less silicon is used. And the device advantageously produces less heat dissipation which may allow to use cheaper IC packages reducing, again, the cost of the device.

The increased performance margin 706 between noise level 1 (704) and noise level 2 (705) may be necessary for certain applications, such as converting large input signals to control motors of robotic or automated industrial manufacturing systems and devices. According to embodiments of the present invention, the increased performance margin realized during sampling can be used to lower the amplitude of input signal 1 (705) so that ADCs using smaller, thin-gate devices can convert the input signal without experiencing damage, stress, or other reliability issues. In this way, a SAR ADC implementation is provided that can convert relatively large input signals while providing low-latency and low-power dissipation for industrial applications. Embodiments of the present invention disclosed have no limitation regarding the magnitude of the input signal and can be configured to be compatible with any voltage level required by the specific application.

As depicted in chart 750, input signal 1 (705) can be reduced to the level of input signal 2 (751) by internally attenuating input signal 1 (705). In this way, the performance margin 706 gained during sampling can be applied to lower the amplitude of input signal 1 (705) so that a relatively large input signal can be accommodated by a relatively small and fast ADC (e.g., a SAR ADC using "thin gate" devices). In this case, the performance level remains at the original target level SNR1 (702), and ADCs using smaller, "thin gate" devices can be used to perform at higher rates due to the attenuated input signal, resulting in lower latency.

FIG. 8 depicts an exemplary SAR ADC implementation 800 using a DAC capacitor matrix configured using charge redistribution to internally attenuate the input signal of a switched-cap SAR ADC front-end according to embodiments of the present invention. FIG. 8 depicts an exemplary unity gain SAR ADC switch configuration and FIG. 9 depicts an exemplary 2× attenuation factor SAR ADC switch configuration according to embodiments of the present invention.

As depicted in FIG. 8, a differential signal 3-bit ADC with split-cap array configuration can be used to achieve unity gain. The 3-bit ADC with split-cap array configuration is merely exemplary and any suitable ADC may be used and configured as needed. Switched capacitors 801 and 802 are configured (e.g., switched) to receive input from $V_{inp}$ during the sampling phase. Switched capacitors 803 and 804 are configured to receive input from $V_{inn}$ during the sampling phase. Specifically, the switches are closed so that capacitors of switched capacitors 801, 802, 803, and 804 receive input signals as depicted in FIG. 8. As depicted in FIGS. 8 and 9, the capacitors can include C+C+2C+4C capacitors. During the decision phase, switched capacitors 801 and 803 are configured to receive input from $V_{refp}$, and switched capacitors 802 and 804 are configured to receive input from $V_{refn}$. In this configuration, the differential voltage $V_{cn}-V_{cp})=V_{inp}-V_{inn}$.

Comparator 814 is used to compare the two values (e.g., voltages) that are provided as inputs and outputs a digital signal (e.g., 0 or 1). The comparator input between $V_{cn}$ and $V_{cp}$ is switched so that the input to comparator 814 can be selectively opened and closed. Specifically, during sampling the switched input of comparator 814 is closed so that $V_{cn}$ is shorted with $V_{cp}$. During the decision phase the switched input of comparator 814 is open. If the voltage at the positive input $V_{cp}$ is higher than that at the negative input $V_{cn}$, the comparator will output a value of '1'. If the voltage at the positive input $V_{cp}$ is lower than that at the negative input $V_{cn}$, the comparator will output a value of '0'. In the exemplary SAR ADC implementation 800, the comparator 814 is used to sequentially compare the analog input signal ($V_{in}$ and $V_{inn}$) with multiple references voltages ($V_{refp}$ and $V_{refn}$) until the difference between the differential input signal and the differential reference signal is below a certain specification. The sequential selection of the reference voltages is done based on the comparator output level for each decision step. The combination of the comparator output levels from each step results in the SAR ADC digital output word.

As depicted in FIG. 9, changing the switching configuration of switches 801, 802, 803, and 804 during the sampling phase changes the differential voltage, where $V_{cn}-V_{cp}=\frac{1}{2}*(V_{inp}-V_{inn})$. In this case, switches of the 4C capacitors are open thereby attenuating the input signal advantageously. Both the exemplary SAR ADC implementations 800 and 900 assume the existence of a reset phase prior to the sampling phase.

The exemplary schematic diagrams and switching configurations depicted in FIGS. 8 and 9 provide low-power, low-latency ADCs that are well-suited to industrial motor control applications, as well as battery powered devices that require low-power dissipation, low heat dissipation, or a relatively small footprint/packaging. The exemplary schematic diagrams and switching configurations depicted in FIGS. 8 and 9 are also well-suited to medical and aeronautical applications, for example.

Figure 10:
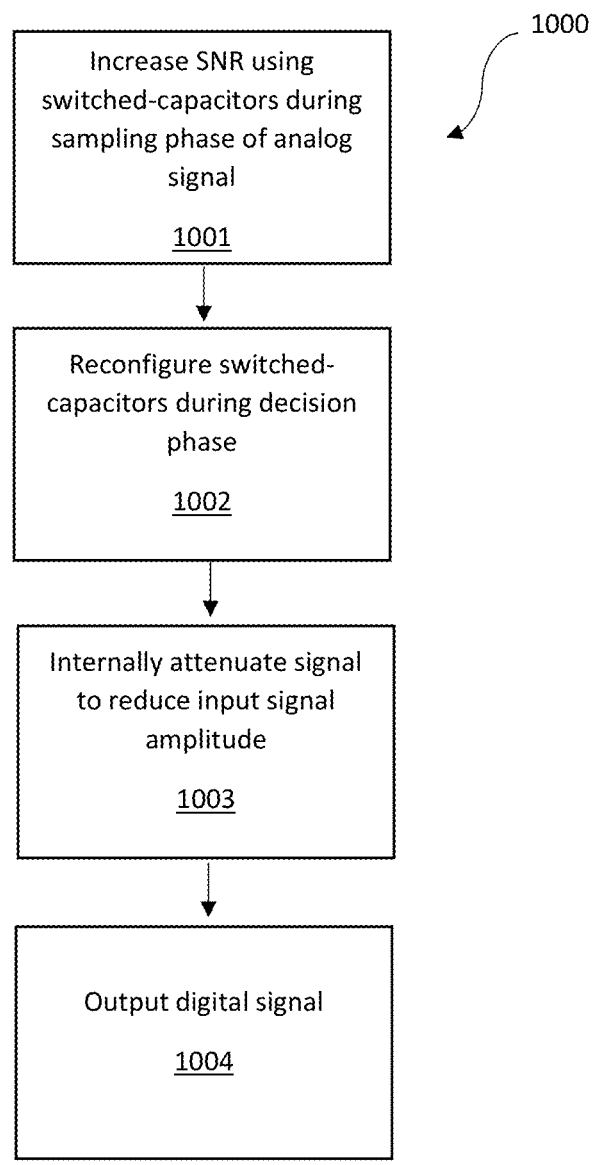
FIG. 10 is a flow chart depicting an exemplary sequence of steps performed by an electronic circuit (e.g., a SAR ADC including thin gate devices) to convert an analog input signal to a digital output signal according to embodiments of the present invention.

FIG. 10 is a flow chart depicting an exemplary sequence of steps 1000 performed by an electronic circuit (e.g., a SAR ADC using thin gate devices) to convert an analog input signal to a digital output signal according to embodiments of the present invention.

At step 1001, a performance margin is achieved by increasing the SNR of the electronic circuit using switched-capacitors during a sampling phase of an analog input signal.

At step 1002, the switched-capacitors are reconfigured (e.g., switched) during a decision phase of the electronic circuit.

At step 1003, the analog input signal received by the electronic signal is attenuated internally using the switched-capacitors to reduce the amplitude of the input signal.

At step 1004, a digital output is produced by the electronic circuit according to the sampling phase and the decision phase.

Embodiments of the present invention are thus described. While the present invention has been described in particular embodiments, it should be appreciated that the present invention should not be construed as limited by such embodiments, but rather construed according to the following claims.

What is claimed is:

1. A device for converting an analog signal to a digital signal, said device comprising:
   a successive approximation register (SAR) analog-to-digital converter (ADC) comprising a plurality of switched capacitors and a comparator that receives input from the plurality of switched capacitors;
   a sampling phase configuration for the plurality of switched capacitors for performing a sampling phase by the SAR ADC;
   a decision phase configuration for the plurality of switched capacitors for performing a decision phase by the SAR ADC; and
   wherein the plurality of switched capacitors increase a signal-to-noise ratio level of the SAR ADC to achieve a performance margin during the sampling phase performed by the SAR ADC, wherein one or more switched capacitors of the plurality of switched capacitors are operable to be switched to internally attenuate the analog input signal according to the performance margin during the decision phase performed by the SAR ADC, and wherein the SAR ADC outputs the digital signal according to the sampling phase and the decision phase performed by the SAR ADC using the comparator.

2. The device recited in claim 1, wherein said SAR ADC comprises a SAR ADC including thin gate transistors.

3. The device recited in claim 1, wherein the one or more switched capacitors of the plurality of switched capacitors are operable to be switched using charge redistribution.

4. The device recited in claim 1, wherein said device further comprises a reset phase configuration that is performed by the SAR ADC before said sampling phase configuration is performed by the SAR ADC.

5. The device recited in claim 1, wherein said one or more switched capacitors of the plurality of switched capacitors are operable to provide a unity gain.

6. The device recited in claim 1, wherein said one or more switched capacitors of the plurality of switched capacitors are operable to internally attenuate the analog input signal by an attenuation factor of 2.

7. The device recited in claim 1, wherein said SAR ADC comprises a 3-bit ADC.

8. The device recited in claim 1, wherein the device provides relatively low-latency and relatively low-power dissipation for motor control operations.

9. The device recited in claim 1, wherein said device is operable to convert the analog input signal of an automated manufacturing system.

10. The device recited in claim 1, wherein the device is battery powered.

11. A method of converting an analog input signal to a digital signal using a successive approximation register (SAR) analog-to-digital converter (ADC), said method comprising:
    increasing a signal-to-noise ratio level of the SAR ADC to achieve a performance margin during a sampling phase performed by the SAR ADC, wherein the SAR ADC comprises a plurality of switched capacitors;

reconfiguring one or more switched capacitors of the plurality of switched capacitors to internally attenuate the analog input signal according to the performance during a decision phase performed by the SAR ADC; and outputting the digital signal according to the sampling phase and the decision phase performed by the SAR ADC.

12. The method recited in claim 11, wherein said SAR ADC comprises a SAR ADC using thin gate transistors.

13. The method recited in claim 11, wherein reconfiguring one or more switched capacitors of the plurality of switched capacitors comprises switching the one or more switched capacitors of the plurality of switched capacitors using charge redistribution.

14. The method recited in claim 11, wherein said method further comprises performing a reset phase before said sampling phase.

15. The method recited in claim 11, wherein said one or more switched capacitors of the plurality of switched capacitors are operable to provide a unity gain.

16. The method recited in claim 11, wherein said one or more switched capacitors of the plurality of switched capacitors are operable to internally attenuate the analog input signal by an attenuation factor of 2.

17. The method recited in claim 11, wherein said SAR ADC comprises a 3-bit ADC.

18. The method recited in claim 11, wherein the device provides relatively low-latency and relatively low-power dissipation for motor control operations.

19. The method recited in claim 11, wherein said device is operable to convert the analog input signal of an automated manufacturing system.

20. The method recited in claim 11, wherein said SAR ADC is battery powered.

\* \* \* \* \*